(12) United States Patent
    Chang et al.

(10) Patent No.: US 9,388,493 B2
(45) Date of Patent: Jul. 12, 2016

(54) SELF-CLEANING SHUTTER FOR CVD REACTOR

(71) Applicant: Veeco Instruments Inc., Plainview, NY (US)

(72) Inventors: Chenghung Paul Chang, Easton, PA (US); Keng Moy, Basking Ridge, NJ (US); Alexander I. Gurary, Bridgewater, NJ (US)

(73) Assignee: Veeco Instruments Inc., Plainview, NY (US)

( * ) Notice: Subject to any disclaimer, the term of this patent is extended or adjusted under 35 U.S.C. 154(b) by 631 days.

(21) Appl. No.: 13/736,439

(22) Filed: Jan. 8, 2013

(65) Prior Publication Data
    US 2014/0190405 A1    Jul. 10, 2014

(51) Int. Cl.
    *C23C 16/44*      (2006.01)
    *C23C 16/458*     (2006.01)

(52) U.S. Cl.
    CPC ......... *C23C 16/4407* (2013.01); *C23C 16/4409* (2013.01); *C23C 16/4585* (2013.01)

(58) Field of Classification Search
    CPC ............ C23C 16/4407; C23C 16/4409; C23C 16/45587–16/45591; C23C 16/4584; C23C 16/4585; H01L 21/67109; H01L 21/67115; H01L 21/68735; H01L 21/68764; H01L 21/68771; H01J 37/32633; H01J 37/32642; H01J 37/32853; H01J 37/32862; B05C 11/00
    See application file for complete search history.

(56) References Cited

U.S. PATENT DOCUMENTS

| 5,152,842 | A |   | 10/1992 | Urata et al. |
| 5,884,009 | A | * | 3/1999  | Okase ........................... 392/418 |
| 6,074,518 | A | * | 6/2000  | Imafuku et al. .......... 156/345.46 |
| 6,213,478 | B1 |  | 4/2001  | Nishikawa |
| 6,261,408 | B1 |  | 7/2001  | Schneider et al. |
| 6,419,751 | B1 |  | 7/2002  | Nagashima |

(Continued)

FOREIGN PATENT DOCUMENTS

| CN | 101448971 A | 6/2009 |
| CN | 101495675 A | 7/2009 |

(Continued)

OTHER PUBLICATIONS

Taiwanese Office Action for Applicaion No. 100149862 dated Aug. 13, 2014.

(Continued)

*Primary Examiner* — Karla Moore
*Assistant Examiner* — Benjamin Kendall
(74) *Attorney, Agent, or Firm* — Lerner, David, Littenberg, Krumholz & Mentlik, LLP (57) ABSTRACT

A chemical vapor deposition reactor and a method of wafer processing are provided. The reactor can include a reaction chamber having an interior and an entry port for insertion and removal of substrates, a gas inlet manifold communicating with the interior of the chamber for admitting process gasses to form a deposit on substrates held within the interior, a shutter mounted to the chamber, and one or more cleaning elements mounted within the chamber. The shutter can be movable between (i) a run position in which the cleaning elements are remote from the exhaust channel and (ii) a cleaning position in which the one or more cleaning elements engage with the shutter so that the cleaning elements remove deposited particles from the shutter upon movement of the shutter to the cleaning position.

11 Claims, 3 Drawing Sheets

(56) References Cited

U.S. PATENT DOCUMENTS

| | | | |
|---|---|---|---|
| 6,531,069 B1 | 3/2003 | Srivastava et al. | |
| 6,590,186 B2 | 7/2003 | Tanaka et al. | |
| 6,800,173 B2 * | 10/2004 | Chiang et al. | 156/345.33 |
| 6,902,623 B2 | 6/2005 | Gurary et al. | |
| 7,070,660 B2 | 7/2006 | Keeton et al. | |
| 7,276,124 B2 | 10/2007 | Gurary et al. | |
| 7,865,995 B2 | 1/2011 | Mayer | |
| 8,387,194 B2 | 3/2013 | Mayer | |
| 8,460,466 B2 * | 6/2013 | Gurary | 118/715 |
| 2002/0185068 A1 * | 12/2002 | Gurary et al. | 118/722 |
| 2005/0070105 A1 * | 3/2005 | Bailey et al. | 438/689 |
| 2007/0264840 A1 | 11/2007 | Itatani et al. | |
| 2007/0269983 A1 | 11/2007 | Sneh | |
| 2008/0057197 A1 | 3/2008 | Liu | |
| 2008/0236497 A1 | 10/2008 | Vukovic et al. | |
| 2010/0206231 A1 | 8/2010 | Yoon et al. | |
| 2011/0215071 A1 | 9/2011 | Mitrovic et al. | |
| 2012/0027936 A1 * | 2/2012 | Gurary | 427/255.5 |
| 2012/0171870 A1 * | 7/2012 | Mitrovic et al. | 438/706 |
| 2013/0298831 A1 * | 11/2013 | Shamoun et al. | 118/725 |

FOREIGN PATENT DOCUMENTS

| | | |
|---|---|---|
| EP | 0272140 A2 | 6/1988 |
| JP | 63-020464 | 1/1988 |
| JP | 05202474 A | 8/1993 |
| JP | 05263249 | 10/1993 |
| JP | 11-158632 | 6/1999 |
| JP | 03063573 U | 11/1999 |
| JP | 2000058529 A | 2/2000 |
| JP | 2000216097 A | 8/2000 |
| JP | 2005251988 A | 9/2005 |
| JP | 2008252106 A | 10/2008 |
| JP | 2009064850 A | 3/2009 |
| JP | 2010202982 A | 9/2010 |
| JP | 2010538489 A | 12/2010 |
| TW | 200804619 A | 1/2008 |
| TW | 200905010 A | 2/2009 |
| TW | 201023258 A | 6/2010 |
| TW | 201030179 A | 8/2010 |
| WO | 2009049020 A2 | 4/2009 |
| WO | 2009148913 A2 | 12/2009 |

OTHER PUBLICATIONS

Singapore Examination Report for Application No. 2013007018 dated Jun. 20, 2014.
Japanese Office Action for Application No. JP 2013-523263 dated Jan. 6, 2015.
International Search Report and Written Opinion Application No. PCT/US2011/046215, dated Oct. 19, 2011.
International Search Report and Wirtten Opinion for Application No. PCT/US2011/066489 dated Apr. 26, 2012.
Taiwan Search Report for Application No. 100149862 dated Apr. 24, 2014.
Walker R et al: "Novel high temperature metal organic chemical vapor deposition vertical rotating-disk reactor with multizone heating for GaN and related materials", Materials Science and Engineering B. Elsevier Sequoia, Lausanne. CH, vol. 35. No. 1, Dec. 1, 1995, pp. 97-101, XP004000684, ISSN: 0921-5107. DOI:10.1016/0921-5107(95)01366-0.

* cited by examiner

SELF-CLEANING SHUTTER FOR CVD REACTOR

BACKGROUND OF THE INVENTION

The present invention relates to wafer processing apparatus, to exhaust systems for use in such processing apparatus, and to methods of cleaning the exhaust systems.

Many semiconductor devices are formed by processes performed on a substrate. The substrate typically is slab of a crystalline material, commonly referred to as a "wafer." Typically, a wafer is formed by depositing a crystalline material and is in the form of a disc. One common process for forming such a wafer is epitaxial growth.

For example, devices formed from compound semiconductors such as III-V semiconductors typically are formed by growing successive layers of the compound semiconductor using metal organic chemical vapor deposition or "MOCVD." In this process, the wafers are exposed to a combination of gases, typically including a metal organic compound as a source of a group III metal, and also including a source of a group V element which flow over the surface of the wafer while the wafer is maintained at an elevated temperature. Typically, the metal organic compound and group V source are combined with a carrier gas which does not participate appreciably in the reaction as, for example, nitrogen. One example of a III-V semiconductor is gallium nitride, which can be formed by reaction of an organo gallium compound and ammonia on a substrate having a suitable crystal lattice spacing, as for example, a sapphire wafer. Typically, the wafer is maintained at a temperature on the order of 500-1100° C. during deposition of gallium nitride and related compounds.

Composite devices can be fabricated by depositing numerous layers in succession on the surface of the wafer under slightly different reaction conditions, as for example, additions of other group III or group V elements to vary the crystal structure and bandgap of the semiconductor. For example, in a gallium nitride based semiconductor, indium, aluminum or both can be used in varying proportion to vary the bandgap of the semiconductor. Also, p-type or n-type dopants can be added to control the conductivity of each layer. After all of the semiconductor layers have been formed and, typically, after appropriate electric contacts have been applied, the wafer is cut into individual devices. Devices such as light-emitting diodes ("LEDs"), lasers, and other electronic and optoelectronic devices can be fabricated in this way.

In a typical chemical vapor deposition process, numerous wafers are held on a component commonly referred to as a wafer carrier so that a top surface of each wafer is exposed at the top surface of the wafer carrier. The wafer carrier is then placed into a reaction chamber and maintained at the desired temperature while the gas mixture flows over the surface of the wafer carrier. It is important to maintain uniform conditions at all points on the top surfaces of the various wafers on the carrier during the process. Minor variations in composition of the reactive gases and in the temperature of the wafer surfaces cause undesired variations in the properties of the resulting semiconductor devices.

For example, if a gallium indium nitride layer is deposited, variations in wafer surface temperature or concentrations of reactive gasses will cause variations in the composition and bandgap of the deposited layer. Because indium has a relatively high vapor pressure, the deposited layer will have a lower proportion of indium and a greater bandgap in those regions of the wafer where the surface temperature is higher. If the deposited layer is an active, light-emitting layer of an LED structure, the emission wavelength of the LEDs formed from the wafer will also vary. Thus, considerable effort has been devoted in the art heretofore towards maintaining uniform conditions.

One type of CVD apparatus which has been widely accepted in the industry uses a wafer carrier in the form of a large disc with numerous wafer-holding regions, each adapted to hold one wafer. The wafer carrier is supported on a spindle within the reaction chamber so that the top surface of the wafer carrier having the exposed surfaces of the wafers faces upwardly toward a gas distribution element. While the spindle is rotated, the gas is directed downwardly onto the top surface of the wafer carrier and flows across the top surface toward the periphery of the wafer carrier.

The wafer carrier is maintained at the desired elevated temperature by heating elements, typically electrical resistive heating elements disposed below the bottom surface of the wafer carrier. These heating elements are maintained at a temperature above the desired temperature of the wafer surfaces, whereas the gas distribution element typically is maintained at a temperature well below the desired reaction temperature so as to prevent premature reaction of the gases. Therefore, heat is transferred from the heating elements to the bottom surface of the wafer carrier and flows upwardly through the wafer carrier to the individual wafers.

The used gas is evacuated from the reaction chamber through exhaust ports disposed below the wafer carrier and distributed around the axis of the spindle, typically near the periphery of the chamber. The exhaust ports may have features that restrict the flow of gas into each port, which promotes a uniform flow of gas into the ports. In a conventional CVD reactor, parasitic deposition of products of the reactants can form on the exhaust ports and/or within the exhaust channel. Such parasitic deposition can be periodically removed so that the reactant flow can remain as uniform as possible, thereby improving the uniformity of the process at the wafer surfaces. However, such removal typically requires disassembly of the reactor and thus lost production time.

Although considerable effort has been devoted in the art heretofore to optimization of such systems, still further improvement would be desirable. In particular, it would be desirable to provide better methods of cleaning the exhaust systems.

SUMMARY OF THE INVENTION

A chemical vapor deposition reactor and a method of wafer processing are provided. In accordance with an aspect of the invention, a chemical vapor deposition reactor can include a reaction chamber having an interior and an entry port for insertion and removal of substrates, a gas inlet manifold communicating with the interior of the chamber for admitting process gasses to form a deposit on substrates held within the interior, a shutter mounted to the chamber, and one or more cleaning elements mounted within the chamber. The shutter can be movable between (i) a run position in which the cleaning elements are remote from the exhaust channel and (ii) a cleaning position in which the one or more cleaning elements engage with the shutter so that the cleaning elements remove deposited particles from the shutter upon movement of the shutter to the cleaning position.

In an exemplary embodiment, the shutter can be clear of the entry port in the cleaning position, and the shutter can block the entry port in the closed position. In one example, the shutter can extend around a central axis of the reactor extending in upward and downward directions, and the surface of the shutter can be an inner peripheral surface that generally defines a ring shape. In a particular embodiment, the reactor can also include a flow extender extending around the central axis and having an outer peripheral surface that generally defines a ring shape, the flow extender being movable with shutter between the run position and the cleaning position.

In one embodiment, the one or more cleaning elements can include one or more plates extending generally parallel to the central axis, the one or more plates being configured to clean solid particles from the surface of the shutter when the shutter moves from the run position to the cleaning position. In a particular example, the one or more plates can be configured to be spaced apart from the surface of the shutter when the shutter moves from the run position to the cleaning position. In an exemplary embodiment, the one or more plates can be configured to contact the surface of the shutter when the shutter moves from the run position to the cleaning position.

In one example, the one or more plates can include a plurality of spaced-apart plates arranged circumferentially about the central axis. In a particular embodiment, each of the plates can have one or more guiding features extending from a top edge of the plate toward the central axis at a non-zero angle. In one embodiment, the central axis of the reactor can extend in a vertical direction of the reactor between a top and bottom end of the reactor, and the exhaust system can also include an exhaust manifold located at the bottom end of the reactor and having a passage and one or more ports, the passage communicating with the interior of the chamber through the one or more ports. The plates can be mounted to a top surface of the exhaust manifold.

In a particular example, the exhaust manifold can define a ring shape and the one or more ports can include a plurality of apertures. The reactor can also include one or more port cleaning elements movable between (i) a run position in which the cleaning elements are remote from the one or more ports and (ii) a cleaning position in which the one or more cleaning elements are engaged in the one or more ports. In an exemplary embodiment, the one or more cleaning elements can be a plurality of plungers attached to the shutter, each plunger configured to extend between adjacent ones of the plates in the cleaning position.

In one example, the reactor can also include a spindle mounted within the chamber and configured to rotate about an axis extending in upward and downward directions, an upper end of the spindle configured to releasably engage a wafer carrier configured to hold a plurality of wafers. In a particular embodiment, the reactor can also include a motor drive configured to rotate the spindle about the axis. In one embodiment, the reactor can also include a heater configured to heat the wafer carrier.

In accordance with another aspect of the invention, a method of wafer processing can include (a) providing a reaction chamber defining an interior and including an entry port for insertion and removal of wafer carriers, a shutter mounted to the chamber, and one or more cleaning elements mounted within the chamber, (b) holding one or more wafers on a wafer carrier so that a top surface of each wafer is exposed at a top surface of the wafer carrier, (c) applying one or more process gasses to the exposed top surfaces of the wafers, (d) removing a portion of the process gasses through an exhaust system, so that the process gasses pass by a surface of the shutter, and (e) moving the shutter to a cleaning position so that the surface of the shutter engages the one or more cleaning elements as the shutter moves to the cleaning position, so as to clean a surface of the shutter.

In a particular example, step (e) can include moving the shutter from (i) a run position in which the cleaning elements are remote from the shutter to (ii) the cleaning position in which the one or more cleaning elements engage with the shutter. In an exemplary embodiment, the shutter can be clear of the entry port in the cleaning position, and the shutter can block the entry port in the run position. In one example, the shutter can extend around a central axis of the reactor extending in upward and downward directions, and the surface of the shutter can be an inner peripheral surface that generally defines a ring shape.

In a particular embodiment, step (e) can include moving a flow extender with the shutter, the flow extender extending around the central axis and having an outer peripheral surface that generally defines a ring shape. In one embodiment, step (e) can be performed so as to clean the outer peripheral surface of the flow extender. In a particular example, the one or more cleaning elements can include a plurality of spaced-apart plates arranged circumferentially about the central axis. In an exemplary embodiment, during step (e), the one or more plates can be spaced apart from the surface of the shutter. In one example, during step (e), the one or more plates can contact the surface of the shutter.

In one embodiment, the central axis of the reactor can extend in a vertical direction of the reactor between a top and bottom end of the reactor. The exhaust system can also include an exhaust manifold located at the bottom end of the reactor and having a passage and one or more ports, the passage communicating with the interior of the chamber through the one or more ports. The method can also include the step of (f) moving one or more port cleaning elements into the ports so as to clean the ports. In a particular example, steps (e) and (f) can be performed simultaneously.

In an exemplary embodiment, the method can also include the step of (f) releasably engaging the wafer carrier with an upper end of a spindle mounted within the chamber, the spindle oriented substantially parallel to a central axis extending in upward and downward directions. In one example, the method can also include the step of (g) rotating the spindle and the wafer carrier about the central axis. In a particular embodiment, the method can also include the step of (f) heating the wafers at least in part by heat transfer from the wafer carrier.

DETAILED DESCRIPTION

Figure 1A:
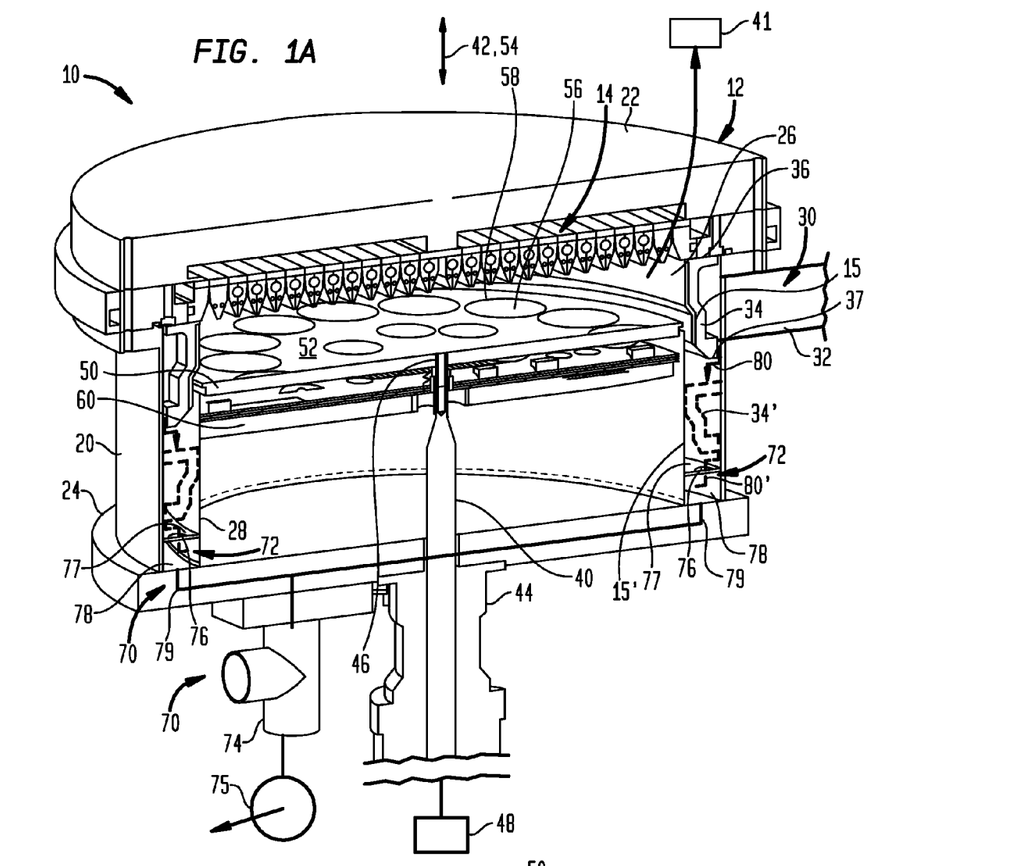
FIG. 1A is a perspective sectional view depicting chemical vapor deposition apparatus in accordance with one embodiment of the invention.
Figure 1B:
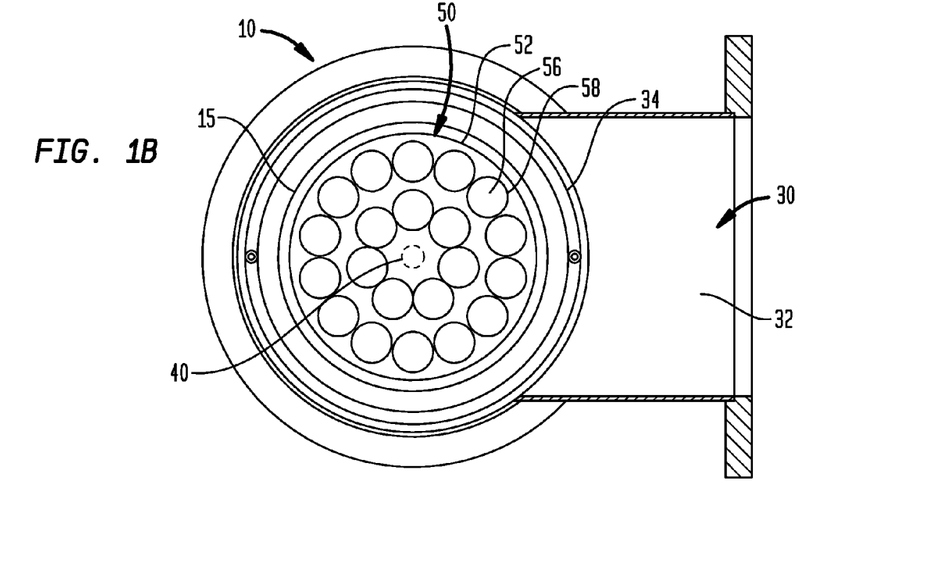
FIG. 1B is a top sectional view of the chemical vapor deposition apparatus of FIG. 1A.

Referring to FIGS. 1A and 1B, a chemical vapor deposition apparatus in the form of a chemical vapor deposition reactor 10 in accordance with one embodiment of the invention includes a reaction chamber 12 having a gas inlet manifold 14 arranged at one end of the chamber 12. The end of the chamber 12 having the gas inlet manifold 14 is referred to herein as the "top" end of the chamber 12. This end of the chamber typically, but not necessarily, is disposed at the top of the chamber in the normal gravitational frame of reference. Thus, the downward direction as used herein refers to the direction away from the gas inlet manifold 14; whereas the upward direction refers to the direction within the chamber, toward the gas inlet manifold 14, regardless of whether these directions are aligned with the gravitational upward and downward directions. Similarly, the "top" and "bottom" surfaces of elements are described herein with reference to the frame of reference of chamber 12 and manifold 14.

The chamber 12 has a cylindrical wall 20 that extends between a top flange 22 at the top end of the chamber and a base plate 24 at the bottom end of the chamber. The wall 20, the flange 22, and the base plate 24 define an air-tight sealed interior region 26 therebetween that can contain gasses emitted from the gas inlet manifold 14. Although the chamber 12 is shown as cylindrical, other embodiments can include a chamber having another shape, including, for example, a cone or other surface of revolution, a square, a hexagon, an octagon, or any other appropriate shape.

The gas inlet manifold 14 is connected to sources for supplying process gases to be used in the wafer treatment process, such as a carrier gas and reactant gases such as a metalorganic compound and a source of a group V metal. In a typical chemical vapor deposition process, the carrier gas can be nitrogen, hydrogen, or a mixture of nitrogen and hydrogen, and hence the process gas at the top surface of a wafer carrier can be predominantly composed of nitrogen and/or hydrogen with some amount of the reactive gas components. The gas inlet manifold 14 is arranged to receive the various gases and direct a flow of process gasses generally in the downward direction.

The gas inlet manifold 14 can also be connected to a coolant system (not shown) arranged to circulate a liquid through the gas distribution element so as to maintain the temperature of the element at a desired temperature during operation. A similar coolant arrangement (not shown) can be provided for cooling the walls of chamber 12.

The chamber 12 is also provided with an entry opening 30 leading to an antechamber 32, and a shutter 34 for closing and opening the entry opening 30. The shutter 34 is movable between a closed position or up position shown in solid lines in FIG. 1A, in which the shutter isolates the interior region 26 of the chamber 12 from the antechamber 32, and an open position or down position as shown in broken lines at 34' in FIG. 1A.

The shutter 34 can be moveable by a control and actuation mechanism 41 (schematically depicted in FIG. 1A) that is coupled to the shutter 34 by one or more linkages (not shown). The control and actuation mechanism 41 can move the shutter 34 between the closed position shown in FIG. 1 and the open position shown as 34'. The control and actuation mechanism can include any type of actuator capable of moving the shutter 34 as for example, mechanical, electro-mechanical, hydraulic, or pneumatic actuators. As can be seen in FIG. 1A, the shutter 34 defines an upper surface 36 facing the gas inlet manifold 14 and a lower edge 37 facing the exhaust manifold 72.

The shutter 34 can be configured as disclosed, for example, in U.S. Pat. No. 7,276,124, the disclosure of which is hereby incorporated by reference herein. Although the shutter 34 is shown as cylindrical, other embodiments can include a shutter having another shape, including, for example, a square, a hexagon, an octagon, or any other appropriate shape.

A spindle 40 is arranged within the chamber so that the central axis 42 of the spindle 40 extends in the upward and downward directions. The spindle is mounted to the chamber by a conventional rotary pass-through device 44 incorporating bearings and seals (not shown) so that the spindle can rotate about the central axis 42, while maintaining a seal between the spindle 40 and the base plate 24 of the chamber 12. The spindle 40 has a fitting 46 at its top end, i.e., at the end of the spindle closest to the gas inlet manifold 14. The fitting 46 is adapted to releasably engage a wafer carrier 50. In the particular embodiment depicted, the fitting 46 is a generally frustoconical element tapering toward the top end of the spindle 40 and terminating at a flat top surface.

The spindle 40 is connected to a rotary drive mechanism 48 such as an electric motor drive, which is arranged to rotate the spindle about the central axis 42. The spindle 40 can also be provided with internal coolant passages extending generally in the axial directions of the spindle within the gas passageway. The internal coolant passages can be connected to a coolant source, so that a fluid coolant can be circulated by the source through the coolant passages and back to the coolant source.

Figure 3A:
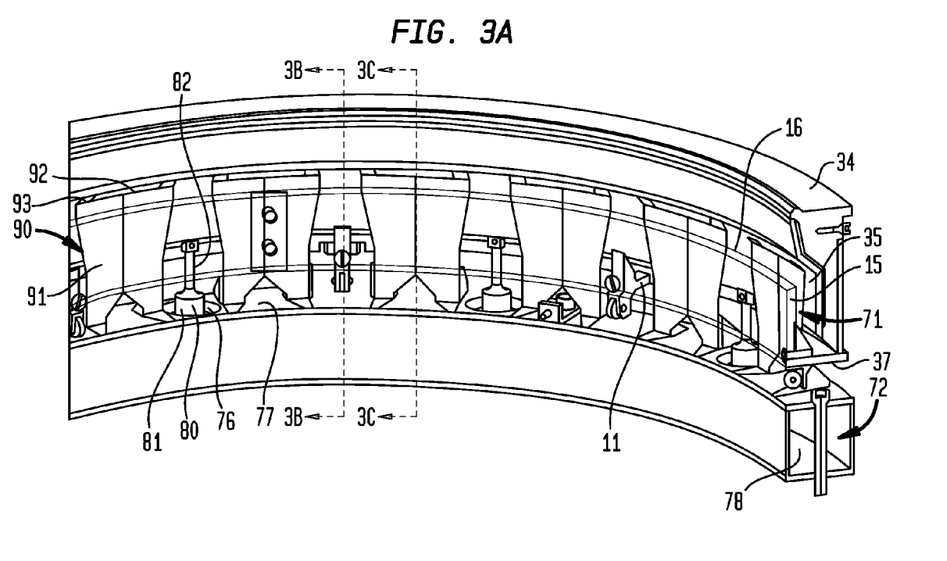
FIG. 3A is a fragmentary perspective sectional view of the apparatus of FIG. 1A, shown in a different position.
Figure 3B:
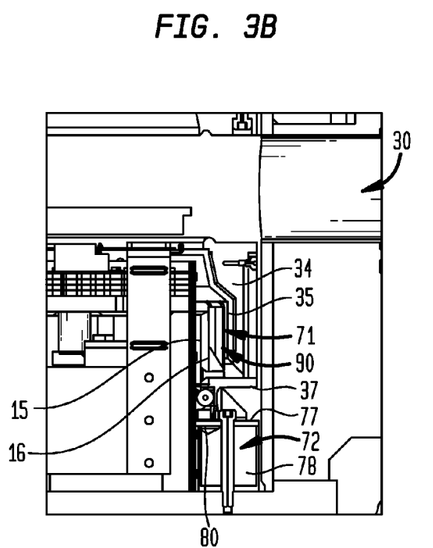
FIG. 3B is a fragmentary perspective sectional view of the chemical vapor deposition apparatus of FIG. 3A, taken through the line 3B-3B.

The wafer carrier 50 includes a body 52 which is substantially in the form of a circular disc having a central axis 54. In the operative position shown in FIGS. 1 and 3, the central axis 54 of the wafer carrier body 52 is coincident with the axis 42 of the spindle. The body 52 can be formed as a single piece or as a composite of plural pieces. For example, as disclosed in U.S. Published Patent Application No. 20090155028, the disclosure of which is hereby incorporated by reference herein, the wafer carrier body may include a hub defining a small region of the body 62 surrounding the central axis 54 and a larger portion defining the remainder of the disc-like body.

The wafer carrier body 52 can be formed from materials that do not contaminate the CVD process and that can withstand the temperatures encountered in the process. For example, the larger portion of the disc may be formed largely or entirely from materials such as graphite, silicon carbide, or other refractory materials. The body 52 has generally planar top and bottom surfaces extending generally parallel to one another and generally perpendicular to the central axis 54 of the disc. The body 52 also has a plurality of generally circular wafer-holding pockets 56 extending downwardly into the body 52 from the top surface thereof, each pocket adapted to hold a wafer 58. In one example, the wafer carrier body 52 can be about 100 mm to about 1000 mm in diameter.

A substrate in the form of a wafer 58, such as a disc-like wafer formed from sapphire, silicon, or other crystalline substrate, can be disposed within each pocket 56 of the wafer carrier 50. Typically, each wafer 58 has a thickness which is small in comparison to the dimensions of its major surfaces. For example, a circular wafer 58 about 2 inches (50 mm) in diameter may be about 430 µm thick or less. Each wafer 58 is disposed with a top surface thereof facing upwardly, so that the top surface is exposed at the top of the wafer carrier 50.

The reactor 10 can further include a loading mechanism (not shown) capable of moving the wafer carrier 50 from the antechamber 32 into the chamber 12 and engaging the wafer carrier 50 with the spindle 40 in the operative condition, and also capable of moving the wafer carrier 50 off of the spindle 40 and through the antechamber 32.

The reactor 10 can also include a flow extender in the form of a ring 15 that is configured to permit a substantially uniform process gas boundary layer thickness over substantially the entire top surface of the wafer carrier 50 during wafer processing, as described, for example, in U.S. Patent Application Publication No. 2012/0171870, which is hereby incorporated by reference herein.

The ring 15 can be mounted to the shutter 34 by a plurality of struts 11 (FIG. 3A) disposed around the circumference of the ring. As can be seen in FIG. 2C, for example, the ring 15 is disposed radially inside of the shutter 34 (i.e., the ring is closer to the central axis 42 of the spindle 40 than the shutter), such that an outer peripheral surface 16 of the ring faces an inner peripheral surface 35 of the shutter. The ring 15 is movable with the shutter 34 between an up position shown in solid lines in FIG. 1A and a down position as shown in broken lines at 15' in FIG. 1A. The ring 15 may have a ring-like cross sectional shape, and the ring and shutter may have central axes generally coincident (within manufacturing and assembly tolerance) with the central axis 42 of the spindle 40. In some embodiments, the ring 15 may be omitted from the reactor 10.

A heating element 60 is mounted within the chamber 12 and surrounds the spindle 40 below the fitting 46. The heating element 60 can transfer heat to the bottom surface of the wafer carrier 50, principally by radiant heat transfer. Heat applied to the bottom surface of the wafer carrier 50 can flow upwardly through the body 52 of the wafer carrier 50 to the top surface thereof. Heat can pass upwardly to the bottom surface of each wafer 58, and upwardly through the wafer 58 to the top surface thereof. Heat can be radiated from the top surface of the wafer carrier 50 and from the top surfaces of the wafers 58 to the colder elements of the process chamber 12 as, for example, to the walls 20 of the process chamber 12 and to the gas inlet manifold 14. Heat can also be transferred from the top surface of the wafer carrier 50 and the top surfaces of the wafers 58 to the process gas passing over these surfaces.

The chamber 12 also includes an outer liner 28 that can reduce process gas penetration into the area of the chamber containing the heating element 60. In an example embodiment, heat shields 29 (FIG. 2C) can be provided below the heating element 60, for example, disposed parallel to the wafer carrier 50, to help direct heat from the heating element upwards towards the wafer carrier 50 and not downwards towards the base plate 24 at the bottom end of the chamber 12. In one example, the flow extender ring 15 can help direct heat from the heating element 60 towards the wafer carrier 50. Additional details regarding the ability of the ring 15 to direct heat towards the wafer carrier 50 can be found in U.S. Patent Application Publication No. 2012/0171870, which is hereby incorporated by reference herein.

The chamber 12 is also equipped with an exhaust system 70 arranged to remove spent gases from the interior region 26 of the chamber. The exhaust system 70 includes an exhaust channel 71 (FIG. 2C) that may be defined between the outer peripheral surface 16 of the ring 15 and the inner peripheral surface 35 of the shutter 34. The exhaust system 70 also includes an exhaust manifold 72 at or near the bottom of the chamber 12, below the top of the spindle 40 and below the wafer carrier 50. The exhaust manifold 72 is coupled to an exhaust conduit 74 (FIG. 1A) that extends downward through the base plate 24 and is configured to carry spent gasses out of the reaction chamber 12.

The exhaust channel 71 and the exhaust manifold 72 may each extend around the periphery of the chamber 12. The exhaust manifold 72 defines a passage 78. Although the passage 78 is shown as cylindrical or ring-shaped, other embodiments can include a passage 78 having another shape, including, for example, a square, a hexagon, an octagon, or any other appropriate shape.

The exhaust manifold 72 can include a plurality of ports 76 in the form of round apertures extending through a top surface 77 of the manifold 72 from the interior region 26 of the chamber 12 into the passage 78. The passage 78 can be coupled to two exhaust ports 79 at diametrically opposed locations. Each exhaust port 79 extends between the passage 78 and the exhaust conduit 74. The conduit 74 in turn is connected to a pump 75 or other vacuum source.

The ports 76 are of relatively small diameter, as for example, about 0.5" to about 0.75". The ports 76 provide a low fluid conductance element that creates a flow rate restriction between the interior region 26 of the chamber 12 and the passage 78 of the exhaust manifold 72. The exhaust manifold 72 thus provides a pressure barrier between the interior region 26 of the chamber 12 and the exhaust ports 79, thereby providing increased uniformity of the flow of reactants inside of the chamber 12. Because the flow resistance within the passage 78 is small, the flows through all of the ports 76 are substantially equal. This provides a substantially uniform flow of waste gas into the passage 78 around the periphery of the chamber 12.

In a particular example, the exhaust manifold 72 can include approximately ten ports 76, each port 76 located approximately 36° apart from each adjacent port 76. In other embodiments, the exhaust manifold can include any number of ports, each port located any distance apart from each adjacent port. The ports 76 can be spaced apart from one another along the top surface of the exhaust manifold 72. In one example, the ports can be spaced equidistantly from one another about the top surface 77 of the exhaust manifold 72.

As shown, the exhaust manifold 72 includes ports 76 that are circular in shape. In other embodiments, the apertures in the exhaust manifold can define any shape, including for example, oval, parabolic, square, rectangular, triangular, hexagonal, octagonal, crescent-shaped, or S-shaped.

As shown, each port 76 extends horizontally across approximately three-quarters of the width of the top surface 77, in a radial direction from the central axis of the reaction chamber. In other embodiments, each port can extend across any portion of the width of the top surface of the exhaust manifold, including approximately half, two-thirds, four-fifths, or nine-tenths of the width of the top surface.

If a low fluid conductance element such as the ports 76 of the exhaust manifold 72 was not included in the chamber 12, the location of the two diametrically opposed exhaust ports 79 could cause a pressure gradient around the circumference of the chamber 12, thereby producing non-uniform gas flow across the wafer carrier 50, which can cause undesired variations in the properties of the resulting semiconductor wafers 58.

Process gas flow rate restriction occurring within the exhaust channel 71 and the exhaust manifold 72 can result in parasitic deposition of solid particles (e.g., products of the reactants) formed in the exhaust channel 71 and in and around the ports 76 during operation of the reactor 10. Such solid particles can reduce the cross-sectional area of the exhaust channel 71 in a plane parallel to the wafer carrier 50 and can reduce the size of or completely block some or all of the ports 76. Such changes in the cross-sectional area of the exhaust channel 71 and the size of the ports 76 can cause non-uniform flow rates through the exhaust channel and through the ports 76, which can result in undesired variations in the process gas flow and thus affect the properties of the wafers 58 formed by the reactor 10. Partial blockage of the exhaust channel 71 and one or more of the ports 76 can also cause a non-uniform growth rate of the wafers 58.

Figure 2A:
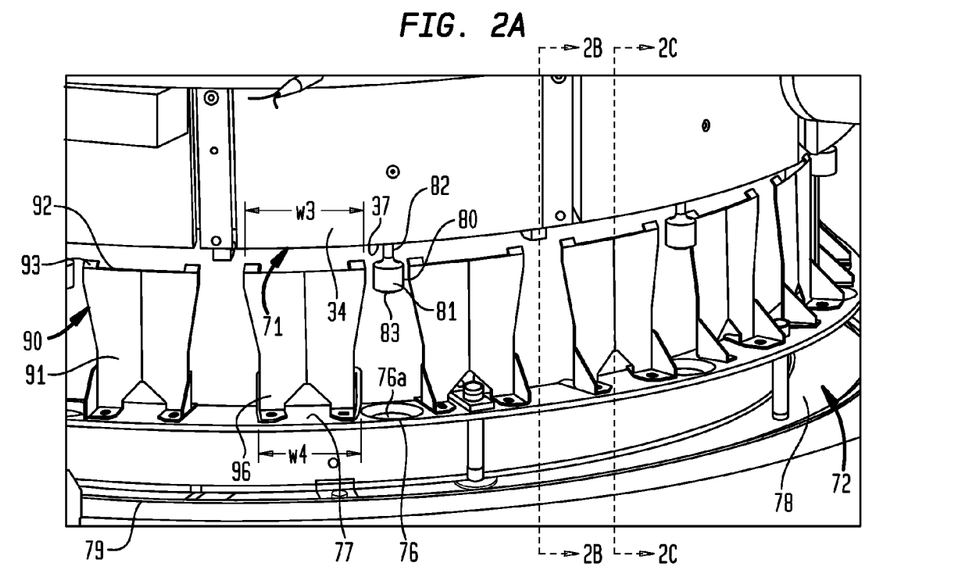
FIG. 2A is a fragmentary perspective view depicting an embodiment of elements of the chemical vapor deposition apparatus of FIG. 1A, shown in one position.

Referring now to FIG. 2A, the reactor 10 can further include a plurality of exhaust port cleaning elements in the form of plungers 80, each plunger extending downward from the shutter 34 from a location at or near the lower edge 37 thereof, such that the plungers 80 translate up and down with the shutter 34 relative to the exhaust manifold 72. Each plunger 80 is configured to clean solid particles from a respective port 76.

Each plunger 80 also includes a contact element in the form of a body 81 that can define a diameter that is approximately equal to or slightly smaller than a respective port 76, such that each plunger 80 can dislodge solid particles off of the inside edge of the respective port 76 as the plunger 80 is translated up and down relative to the top surface 77 of the exhaust manifold 72. As best shown in FIG. 2A, each plunger 80 is attached to the shutter 34 near the lower edge 37 thereof, and each plunger 80 includes a shaft 82 extending between the shutter 34 and the body 81.

Each plunger 80 can also have a conical tip 83 at a lower end of the body 81. The conical tip 83 can serve as a contact element that can scrape solid particles off of the inside edge of the respective port 76. Having a conical tip may allow the pluralities of plungers to self-locate relative to the respective ports 76 as the shutter 34 is moved downward, such that if the conical tips 83 are misaligned with the respective ports 76, the contact between the conical tips and the top surface 77 can cause the plungers 80 to move the shutter 34 slightly horizontally until the plungers can slide downward into the respective ports 76. The plunger shafts 82 desirably have sufficient flexibility in the horizontal direction (perpendicular to the central axis 42 of the spindle 40) to allow such self-centering.

Although each cleaning element 80 is shown in the figures as having a body 81 that is cylindrical in shape and a tip 83 that is conical in shape, in other embodiments, the cleaning element can define any other shape. For example, the body and tip of each cleaning element can each define any shape, including for example, oval, parabolic, square, rectangular, triangular, hexagonal, octagonal, crescent-shaped, or S-shaped. Examples of other cleaning element configurations can be found in U.S. Patent Application Publication No. 2012/0027936, which is hereby incorporated by reference herein.

Although each cleaning element 80 is shown in the figures as being configured such that the body 81 and/or the conical tip 83 are the elements that contact the inside edge of the respective port 76 as the shutter 34 is moved downward, in other embodiments, each cleaning element may have contact elements in other configurations. In one example, the cleaning element may have a conical tip that has a greater diameter than the body, such that only the conical tip serves as the contact element. In another example, each cleaning element can have a contact element in the form of a radially-extending disc that is located between an upper and lower end of the body, such that only the disc serves as the contact element. In such an example, the lower end of the cleaning element can be moved downward into a port until the disc-shaped contact element contacts the port, thereby scraping solid particles off of the port.

Depending on the relative diameters of each plunger body 81 and a respective port 76, each plunger 80 can be fully inserted into a respective port (e.g., wherein the diameter of the plunger body is less than or equal to the diameter of the port), or each plunger can be partially inserted into a respective port (e.g., wherein the diameter of the plunger body is greater than the diameter of the port). In embodiments where the diameter of the plunger body 81 is greater than the diameter of the respective port 76, the tip 83 can be lowered into the aperture until the periphery of the tip contacts the top surface 77 of the exhaust manifold 72. Such a partial penetration of the tip 83 into a respective port 76 can effectively remove some or all of the solid particles that have become deposited in the port 76.

As shown in FIG. 2A, each port 76 can have a chamfered edge 76a. The angle of the chamfered edge 76a of each port 76 can be any angle, but in some embodiments, the angle may approximately match the angle of the respective tip 83 (e.g., the angle of the chamfered edge of each port and the cone of each tip can be approximately 45 degrees. In such embodiments, where the diameter of the respective tip 83 is greater than the diameter of the port 76, the mating surfaces between the chamfered edge 76a of the port and the conical tip can allow a greater surface area contact between the port and the tip, thereby allowing for the dislodging of a greater amount of solid particles from the port 76.

Figure 2B:
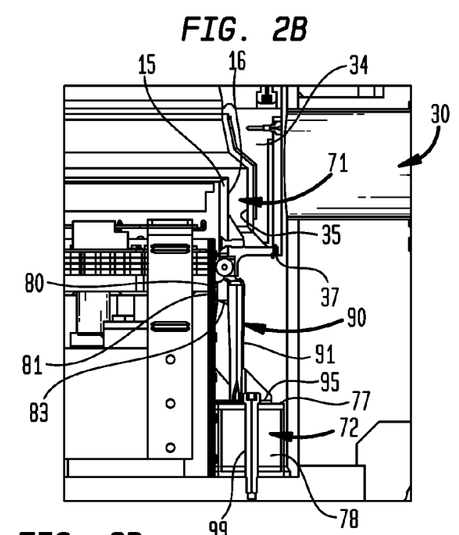
FIG. 2B is a fragmentary perspective sectional view of the chemical vapor deposition apparatus of FIG. 2A, taken through the line 2B-2B.
Figure 2C:
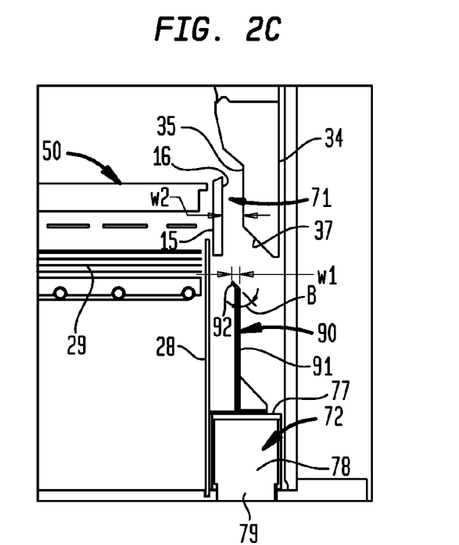
FIG. 2C is a fragmentary side sectional view of the chemical vapor deposition apparatus of FIG. 2A, taken through the line 2C-2C.

Referring to FIGS. 2A through 2C, the reactor 10 can further include a plurality of shutter cleaning elements in the form of plates 90, each plate extending upward from top surface 77 of the exhaust manifold 72, such that the shutter 34 and the ring 15 can translate up and down relative to the plates when the shutter is moved between the positions 34 and 34' shown in FIG. 1A. Each plate 90 is configured to clean solid particles from a respective circumferentially-extending portion of the inner peripheral surface 35 of the shutter 34 and/or the outer peripheral surface 16 of the ring 15.

The reactor 10 can include any number of plates 90. In one example, there can be approximately twenty-four plates 90 arranged circumferentially about the cylindrical wall 20 of the reactor 10, centerlines 91c of adjacent plates being circumferentially spaced approximately 15 degrees apart from one another. Each plate 90 can extend circumferentially approximately 10 degrees of the cylindrical wall 20, such that adjacent plates are separated by 5 degrees from one another. In a particular embodiment, there can be approximately twenty plates 90 arranged circumferentially about the cylindrical wall 20 of the reactor 10, centerlines 91c of adjacent plates being circumferentially spaced approximately 18 degrees apart from one another. In other examples, the reactor 10 can include a number of plates 90 that is equal to two times the number of ports 76 extending through the top surface 77 of the manifold 72, although that need not be the case. For example, in an embodiment having ten ports 76, there can be twenty plates 90, and in an embodiments having twelve ports, there can be twenty-four plates.

Each plate 90 has a body 91 that can define a width W1 (FIG. 2C) that is approximately equal to or slightly smaller than a width W2 of the corresponding circumferential portion of the exhaust channel 71, such that the plates can extend into the exhaust channel as the shutter and ring are translated down relative to the plates. The body 91 of each plate 90 can taper from a width W3 (FIG. 2A) at the top edge 92 to a width W4 at a bottom portion 96 of the body, the width W3 being greater than the width W4.

Figure 2D:
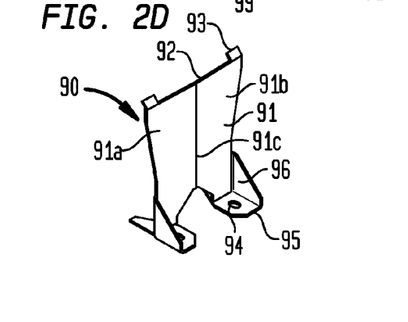
FIG. 2D is a perspective view of the cleaning plate of FIG. 2A.
Figure 2E:
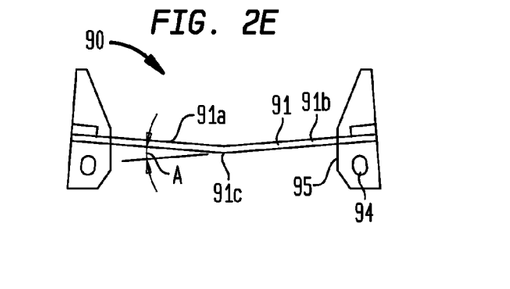
FIG. 2E is a top plan view of the cleaning plate of FIG. 2A.

As shown in FIGS. 2D and 2E, the body 91 of each plate may comprise first and second adjacent portions 91a and 91b that meet at a centerline 91c extending downwardly from a top edge 92 of the plate 90. Each of the portions 91a and 91b may lie in a different plane, such that a plane containing the first portion 91a may intersect a plane containing the second portion 91b at a non-zero angle A such as 5 degrees, for example, thereby permitting each plate 90 to have a concave cross-section approximately matching the angular span of the concave arc of the inner surface 35 of the shutter 34.

In an exemplary embodiment, the angle A between the first and second adjacent portions 91a and 91b may be approximately equal to the circumferential length (in degrees) of the portion of the inner surface 35 of the shutter 34 across which the body 91 extends. In one embodiment, where each plate extends across a 10 degree circumferential arc of the inner surface 35 of the shutter 34, the angle A between the first and second adjacent portions 91a and 91b can be 10 degrees.

Each plate 90 may be attached to the top surface 77 of the exhaust manifold 72 via bolts 99 (FIG. 2B) extending through openings 94 (FIG. 2D) in mounting flanges 95 of the plate. Each mounting flange 95 may extend from the bottom portion 96 of the respective plate.

The top edge 92 of each of the plates 90 can serve as a contact element that can scrape solid particles off of the inner peripheral surface 35 of the shutter 34 and/or outer peripheral surface 16 of the ring 15. Each plate 90 can also have guiding features in the form of two tabs 93 each extending from the top edge 92 of a respective portion 91a or 91b the plate radially inward toward the central axis 42 of the spindle 40 at a non-zero angle B from such as 45 degrees, for example (FIG. 2C).

Figure 3C:
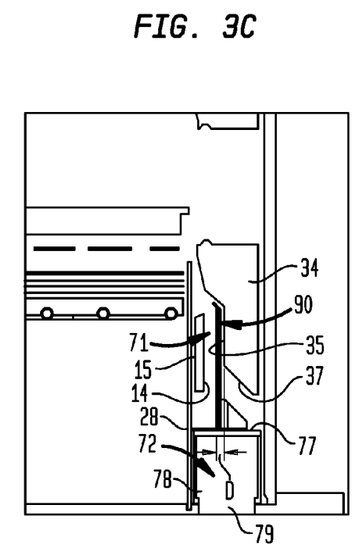
FIG. 3C is a fragmentary side sectional view of the chemical vapor deposition apparatus of FIG. 3A, taken through the line 3C-3C.

As shown in FIG. 2A through 3C, the plates 90 can be configured such that the top edges 92 are slightly spaced apart from the inner peripheral surface 35 of the shutter 34 by a distance D when the shutter is in the down position, as shown in FIG. 3C, such that while the shutter being lowered, the top edges of the plates can contact and dislodge solid particles deposited on the inner peripheral surface 35 of the shutter 34.

Alternatively, or in addition to having one or more of the plates 90 spaced apart from the inner peripheral surface 35 of the shutter 34 when the shutter is in the down position, one or more of the plates can be configured to contact the inner peripheral surface of the shutter when the shutter is lowered. In such an example, one or more of the plates 90 can be configured such that the top edge 92 contacts the inner peripheral surface 35 of the shutter 34, and/or the tabs 93 contact the lower edge 37 of the shutter, so that the plates scrape along the inner peripheral surface and/or the lower edge of the shutter as the shutter is lowered. Such contact may permit the plates 90 to contact and dislodge solid particles deposited on the shutter 34.

In an embodiment where the plates 90 are configured to contact the inner peripheral surface 35 and/or the lower edge 37 of the shutter 34 when the shutter is lowered, the tabs 93 may be adapted to contact a portion of the lower edge of the shutter to guide one or more the plates 90 into alignment with the exhaust channel 71.

To accommodate such contact between the plates 90 and the shutter 34, either or both of the shutter and the plates can be configured to have sufficient flexibility in the horizontal direction (perpendicular to the central axis 42 of the spindle 40) to allow the plates to extend into an area adjacent to but radially inward (closer to the central axis 42) of the inner surface 35 of the shutter as the shutter is lowered. Such flexibility may allow the plates 90 and/or the shutter 34 to self-locate relative to one another as the shutter is moved downward, such that if the plates are misaligned with the inner peripheral surface 35 of the shutter, contact between the plates and the shutter can cause the plates and/or the shutter to move slightly horizontally until the plates extend into an area radially inside of the inner peripheral surface.

Such flexibility may be accommodated by the linkages (not shown) between the chamber 12 and the shutter 34, such that as the shutter moves down, contact between the shutter and some of the plates 90 can deflect the shutter in the horizontal direction, allowing the shutter to self-locate relative to the plates.

In addition to or instead of flexibility being accommodated by the shutter 34, such flexibility may be accommodated by one or more of the plates 90, such that as the shutter moves down, contact between the shutter 34 and the plates can bend or tilt the body 91 of one or more of the plates in the horizontal direction (perpendicular to the central axis 42 of the spindle 40). The plates 90 may have enough flexibility in the horizontal direction to allow the plates to bend sufficiently to extend into an area radially inside of the inner surface 35 of the shutter 34 as the shutter is lowered.

In operation, in a process according to an embodiment of the invention, the entry opening 30 is opened by lowering the shutter 34 and the ring 15 to the respective open positions 34' and 15' so that the plates 90 are inserted into the exhaust channel 71, and so that the plungers 80 are inserted into respective ports 76, thereby removing solid particles that may have deposited in the exhaust channel and/or the ports during a previous operation cycle of the reactor.

Then, a wafer carrier 50 with wafers 58 loaded thereon is loaded from the antechamber 32 into the chamber 12 and is placed in the operative position shown in FIGS. 1A and 1B. In this condition, the top surfaces of the wafers 58 face upwardly, towards the gas inlet manifold 14. The entry opening 30 is closed by raising the shutter 34 and the ring 15 to the up position depicted in solid lines in FIG. 1A, thereby withdrawing the plates 90 from the exhaust channel 71 (or from an area radially inside the inner surface 35 of the shutter if the ring is omitted) and withdrawing the plungers 80 from the ports 76. The heating element 60 is actuated, and the rotary drive 48 operates to turn the spindle 40 and hence the wafer carrier 50 around central axis 42. Typically, the spindle 40 is rotated at a rotational speed from about 50-1500 revolutions per minute.

Process gas supply units (not shown) are actuated to supply gases through the gas inlet manifold 14. The gases pass downwardly toward the wafer carrier 50, over the top surface of the wafer carrier 50 and the top surfaces of the wafers 58, and downwardly around a periphery of the wafer carrier to the exhaust system 70 (which can result in solid particles being deposited onto the inner peripheral surface 35 of the shutter 34, onto the outer peripheral surface 16 of the ring 15, and in the ports 76). Thus, the top surface of the wafer carrier 50 and the top surfaces of the wafers 58 are exposed to a process gas including a mixture of the various gases supplied by the various process gas supply units. Most typically, the process gas at the top surface is predominantly composed of the carrier gas supplied by a carrier gas supply unit (not shown).

The process continues until the desired treatment of the wafers 58 has been completed. Once the process has been completed, the entry opening 30 is opened by lowering the shutter 34 and the ring 15 to the respective positions 34' and 15', thereby inserting the plates 90 into the exhaust channel (or into an area radially inside the inner surface 35 of the shutter if the ring is omitted) and lowering the plurality of plungers 80 into the respective ports 76, thereby removing solid particles that may have deposited on the inner surface of the shutter, the outer surface 16 of the ring, and/or the ports during the just-completed operation cycle of the reactor. Once the entry opening 30 is open, the wafer carrier 50 can be removed from the spindle 40 and can be replaced with a new wafer carrier 50 for the next operational cycle. The structure and method described above provide effective cleaning of the shutter 34, the ring 15, and the flow-restriction ports 76 of the exhaust system 70 during the normal operational cycle. This avoids or minimizes the need to disassemble the system in order to clean the shutter, the flow extender ring, the exhaust system, and/or the ports.

Although in the embodiment shown in the figures, the body 91 of each plate 90 is shown as comprising two planar adjacent portions 91a, 91b intersecting at a non-zero angle A, in other embodiments, the plates can have any shape. For example, the body of each plate can be a single planar portion or a single curvilinear portion such as a portion of a cylinder. In a particular example, the body of each plate can have an arc shaped cross-section approximately matching the arc shape of the adjacent portion of the inner peripheral surface 35 of the shutter 34. In one embodiment, the body of each plate can have two adjacent curvilinear portions intersecting at a non-zero angle. In one example, the body of each plate can be made of three or more planar portions, each portion intersecting with one or more adjacent portions at a non-zero angle.

Although the reactor 10 is described as having the top edge 92 of each plate 90 scrape deposited particles off of the inner peripheral surface 35 of the shutter 34 and/or the outer peripheral surface 16 of the ring 15, in other embodiments, that need not be the case. In one example, one or more of the plates 90 can have bristles extending from the body 91 of the plate, the bristles extending generally in a radially outward direction away from the central axis 42 of the spindle 40 and toward the peripheral surface 35 of the shutter 34. In a particular embodiment, one or more of the plates 90 can have bristles extending generally in a radially inward direction away toward the central axis 42 of the spindle 40 and toward the outer peripheral surface 16 of the ring 15. In one example, one or more of the plates 90 can have bristles extending in both directions from respective sides of the body 91 of the plate.

In a particular embodiment, the body 91 of the plate 90 may have features configured to scrape deposited particles off of the inner peripheral surface 35 of the shutter 34 and/or the outer peripheral surface 16 of the ring 15, such as corrugations extending along the body parallel to or perpendicular to the central axis 42, or protuberances extending in a radially outward direction, a radially inward direction, or in both directions from the surface of the body 91.

Although the body 91 of each plate 90 is shown as having a taper from the top edge 92 to the bottom portion 96, where the top portion is wider than the bottom portion, in other embodiments, the plates can have any shape. For example, one or more plates can have a constant width between the top edge and the bottom portion, or one or more plates can have a taper from the bottom portion to the top portion, where the bottom portion is wider than the top portion.

Although the body 91 of each plate 90 is shown as having guiding features in the form of two tabs 93 each extending from the top edge 92 of the plate, one or more of the plates can have guiding features in other configurations. In one embodiment, the tabs 93 may be omitted. In a particular example, there may be a plurality of tabs extending across the top edge of the plate. In an exemplary embodiment, there may be a single continuous tab extending across the entire top edge of the plate. In one example, the tabs 93 may each extend from the top edge 92 of a respective portion 91a or 91b the plate 90 at other non-zero angles B, such as 5, 10, 15, 20, 30, 50, or 60 degrees.

Although each plate 90 is shown as attached to the top surface 77 of the exhaust manifold 72 via bolts 99, in other embodiments, one or more of the plates can be attached to the exhaust manifold via any other attachment mechanism. For example, the plates can be welded to the exhaust manifold, or the plates can be attached to the exhaust manifold with an adhesive. In a particular example, one or more of the plates 90 can be attached to a surface other than the top surface of the exhaust manifold, such as the outer liner 28 of the chamber 12 or the cylindrical wall 20 of the chamber.

Although a particular number and arrangement of plates 90 are shown in the figures, in other embodiments, there can be any number of plates having any circumferential arrangement about the cylindrical wall 20 of the chamber 12, sized and spaced to provide the desired cleaning functions described above. Centerlines of adjacent plates 90 can be circumferentially spaced from one another by any portion of the cylindrical wall 20 of the reactor 10. Each plate can extend circumferentially about any portion of the cylindrical wall 20 of the reactor 10. Each plate can be separated from adjacent plates by any circumferential portion of the cylindrical wall 20 of the reactor 10.

In embodiments where there is a single plate or only a few plates, such plates can include vertically-extending notches or other features configured to receive the struts 11 that extend between the ring 15 and the shutter 34, so that the struts will not contact the plates when the shutter is moved to the down position. In such embodiments having a single plate or only a few plates, such plates can include vertically-extending notches or other features configured to receive the plungers 80 (in embodiments having plungers), so that the plungers will not contact the plates when the shutter is moved to the down position.

In one variation, the shutter 34, the ring 15, and the control and actuation mechanism 41 can be arranged so that in the normal open position of the shutter and the ring, the plates 90 remain below the exhaust channel 71. The control and actuation mechanism 41 can be arranged to move the shutter 34 and the ring 15 downwardly beyond the normal open position to a special shutter cleaning position, where the plates 90 are inserted into the exhaust channel 71. Movement of the shutter 34 and the ring 15 to the cleaning position can be used as needed, either in every cycle or intermittently.

In another variation, the ring 15 may be omitted, so that when the shutter 34 is moved to the open position 34', the plates 90 extend into an exhaust channel bounded by the inner surface 35 of the shutter and the outer liner 28 of the chamber 12 and/or the wafer carrier 50. In some embodiments, the reactor 10 can include the plates 90 for cleaning the shutter 34 and/or the ring 15, but the plungers 80 can be omitted from the reactor, or another mechanism can be used to dislodge particulate from the ports 76.

In other embodiments (not shown), the plungers can move up and down relative to the exhaust manifold independently of the shutter. For example, the plungers can be attached to a bracket (e.g., a cylindrical bracket) that is located between the shutter and the exhaust manifold. The bracket can be moved up and down by a control and actuation mechanism that is coupled to the reaction chamber by a linkage. However, use of the shutter itself to move the cleaning elements as discussed above considerably simplifies the design and operation of the reactor.

In embodiments where the plungers can move up and down relative to the exhaust manifold independently of the shutter, it is not necessary that the plungers be moved into the apertures of the exhaust manifold following each operational cycle. In such embodiments, the plungers can moved downward to clean the apertures after any number of cycles, including for example, after two, three, four, five, eight, ten, fifteen, or twenty operational cycles.

In a further variation, the plungers 80 may be mounted to the shutter 34, but the shutter 34 and the control and actuation mechanism 41 are arranged so that in the normal open position of the shutter 34, the plungers 80 remain above the ports 76. The control and actuation mechanism 41 can be arranged to move the shutter 34 downwardly beyond its normal open position to a special port-cleaning position, where the plungers 80 are engaged in the ports 76. Movement to the cleaning position can be used as needed, either in every cycle or intermittently.

In one example, the port-cleaning position of the shutter can be the same position as the shutter-cleaning position described above, such that the control and actuation mechanism 41 can be arranged to move the shutter 34 downwardly beyond its normal open position to a cleaning position in which the plates 90 are inserted into the exhaust channel 71 and the plungers 80 are engaged in the ports 76.

In an exemplary embodiment, the control and actuation mechanism 41 can be arranged to move the shutter 34 downwardly beyond its normal open position to a first cleaning position in which the plungers 80 are engaged in the ports 76, and then, the actuation mechanism can continue to move the shutter further downwardly to a second cleaning position in which the plates 90 are inserted into the exhaust channel 71. Alternatively, the first and second cleaning positions can be reversed, such that when the shutter 34 is moved to the first cleaning position, the plates 90 are inserted into the exhaust channel 71, and when the shutter is moved further downwardly to the second cleaning position, the plungers 80 are engaged in the ports 76.

The invention can be applied in various wafer treatment processes as, for example, chemical vapor deposition, chemical etching of wafers, and the like. Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims. It will be appreciated that the various dependent claims and the features set forth therein can be combined in different ways than presented in the initial claims. It will also be appreciated that the features described in connection with individual embodiments may be shared with others of the described embodiments.

The invention claimed is:

1. A chemical vapor deposition reactor comprising:
   (a) a reaction chamber having an interior and an entry port for insertion and removal of wafers, the reaction chamber defining top and bottom ends and a central axis extending in a vertical direction between the top and bottom ends;
   (b) a gas inlet manifold communicating with the interior of the chamber for admitting process gases to form a deposit on the wafers held within the interior;
   (c) a shutter mounted to the chamber and having a lower edge, an outer peripheral surface, and an inner peripheral surface extending around the central axis and generally defining a ring shape, the lower edge extending between the inner and outer peripheral surfaces, the inner peripheral surface extending at a transverse angle relative to the lower edge;
   (d) an exhaust manifold located at the bottom end of the reactor and having a passage and one or more ports, the passage communicating with the interior of the chamber through the one or more ports; and
   (e) one or more cleaning elements mounted to a top surface of the exhaust manifold, the cleaning elements including one or more plates each extending generally parallel to the central axis each having a contact element spaced apart from the exhaust manifold, and each having one or more guiding features extending from a top edge of the plate toward the central axis at a non-zero angle,
   wherein the shutter is movable between (i) a run position in which the contact elements are remote from the shutter and (ii) a cleaning position in which the contact elements engage with the shutter so that the contact elements remove deposited particles from the inner peripheral surface of the shutter upon movement of the shutter to the cleaning position.

2. The reactor as claimed in claim 1, wherein the shutter is clear of the entry port in the cleaning position, and the shutter blocks the entry port in the run position.

3. The reactor as claimed in claim 1, further comprising a flow extender extending around the central axis and having an outer peripheral surface that generally defines a ring shape, the flow extender being movable with shutter between the run position and the cleaning position.

4. The reactor as claimed in claim 1, wherein the one or more plates are configured to be spaced apart from the surface of the shutter when the shutter moves from the run position to the cleaning position.

5. The reactor as claimed in claim 1, wherein the one or more plates are configured to contact the surface of the shutter when the shutter moves from the run position to the cleaning position.

6. The reactor as claimed in claim 1, wherein the one or more plates include a plurality of spaced-apart plates arranged circumferentially about the central axis.

7. The reactor as claimed in claim 1, wherein the cleaning elements are shutter cleaning elements, the exhaust manifold defines a ring shape, and the one or more ports includes a plurality of apertures, the reactor further comprising one or more port cleaning elements movable between (i) a run position in which the port cleaning elements are remote from the one or more ports and (ii) a cleaning position in which the one or more port cleaning elements are engaged in the one or more ports.

8. The reactor as claimed in claim 7, wherein the one or more port cleaning elements is a plurality of plungers attached to the shutter, each plunger configured to extend between adjacent ones of the plates in the cleaning position.

9. The reactor as claimed in claim 1, further comprising a spindle mounted within the chamber and configured to rotate about the central axis, an upper end of the spindle configured to releasably engage a wafer carrier configured to hold the wafers.

10. The reactor as claimed in claim 9, further comprising a motor drive configured to rotate the spindle about the central axis.

11. The reactor as claimed in claim 9, further comprising a heater configured to heat the wafer carrier.

\* \* \* \* \*